United States Patent [19]
Yoo et al.

[11] Patent Number: 5,719,079
[45] Date of Patent: Feb. 17, 1998

[54] METHOD OF MAKING A SEMICONDUCTOR DEVICE HAVING HIGH DENSITY 4T SRAM IN LOGIC WITH SALICIDE PROCESS

[75] Inventors: Chue-San Yoo; Mong-Song Liang; Jin-Yuan Lee, all of Hsin-chu, Taiwan

[73] Assignee: Taiwan Semiconductor Manufacturing Company, Ltd., Hsin-chu, Taiwan

[21] Appl. No.: 654,467

[22] Filed: May 28, 1996

[51] Int. Cl.$^6$ ................................. H01L 21/8244
[52] U.S. Cl. ............... 438/238; 438/241; 148/DIG. 19; 148/DIG. 20
[58] Field of Search ............ 148/DIG. 19, DIG. 20; 438/238, 241

[56] References Cited

U.S. PATENT DOCUMENTS

| | | | |
|---|---|---|---|
| 4,950,620 | 8/1990 | Harrington, III | 437/60 |
| 5,066,602 | 11/1991 | Takemoto et al. | 437/31 |
| 5,187,122 | 2/1993 | Bonis | 437/200 |
| 5,340,762 | 8/1994 | Vora | 437/52 |
| 5,554,549 | 9/1996 | Huang | 437/41 |
| 5,580,806 | 12/1996 | Chang et al. | 437/52 |

OTHER PUBLICATIONS

S. Wolf, "Silicon Processing for the VLSI Era—vol. 2" Lattice Press, Sunset Beach, CA, pp. 571–572, 1990.

Primary Examiner—Jey Tsai
Attorney, Agent, or Firm—George O. Saile; Stephen B. Ackerman

[57] ABSTRACT

A method of forming a local interconnect in an SRAM, simultaneously with the formation of a salicide in logic devices on the same semiconductor substrate, is described. A semiconductor substrate on which MOS (Metal Oxide Semiconductor) transistors have been formed is provided. The transistors are separated by field isolation regions, and each transistor has a gate overlying a gate oxide and has source and drain regions in the substrate. Spacers are provided on the sidewalls of the gates, and some of the field oxide regions in the SRAM have polysilicon interconnects, with sidewall spacers. The sidewall spacers are removed from the polysilicon interconnects. A layer of titanium is deposited over the semiconductor substrate. A salicide is formed over the gates, the source and drain regions, and the polysilicon interconnects, so that the local interconnect is formed connecting the polysilicon interconnects to one of the source regions.

13 Claims, 4 Drawing Sheets

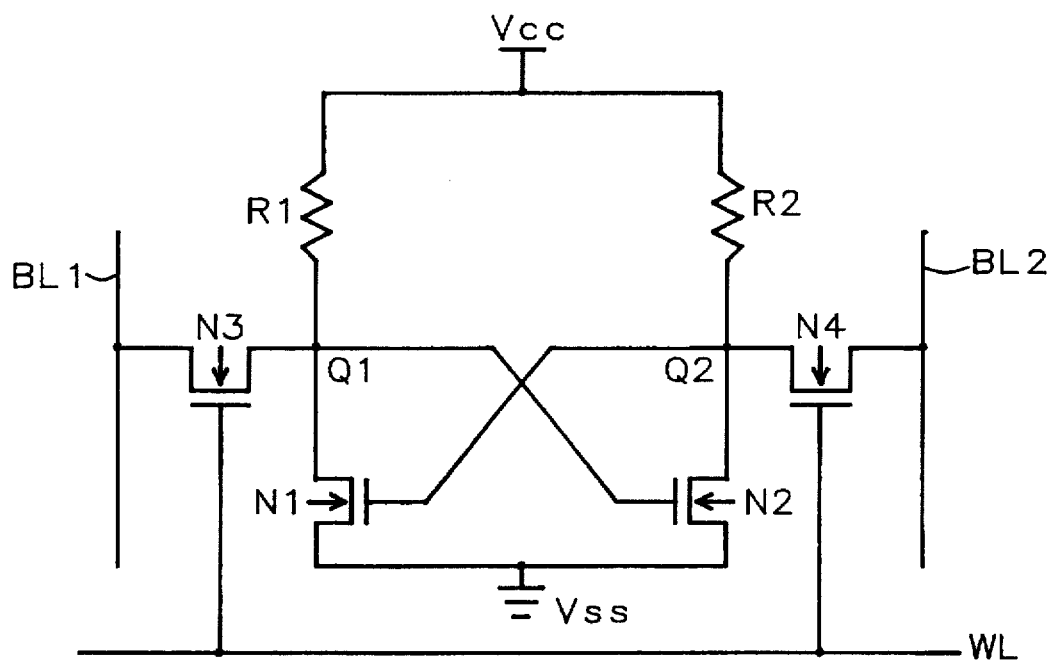
FIG. 1
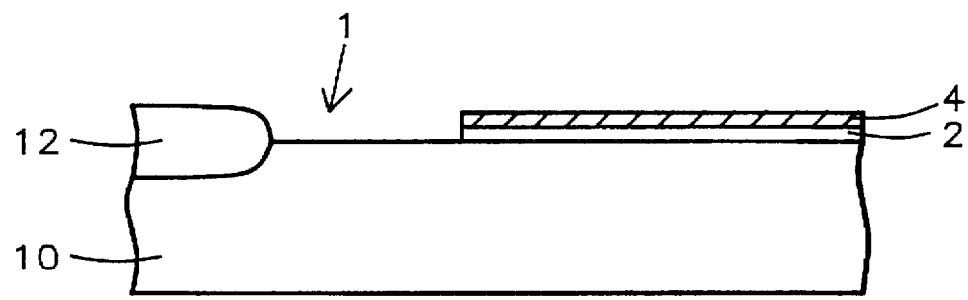
FIG. 2 – Prior Art

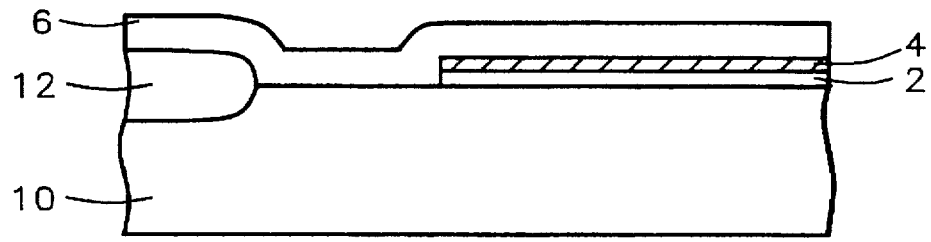
FIG. 3 - Prior Art
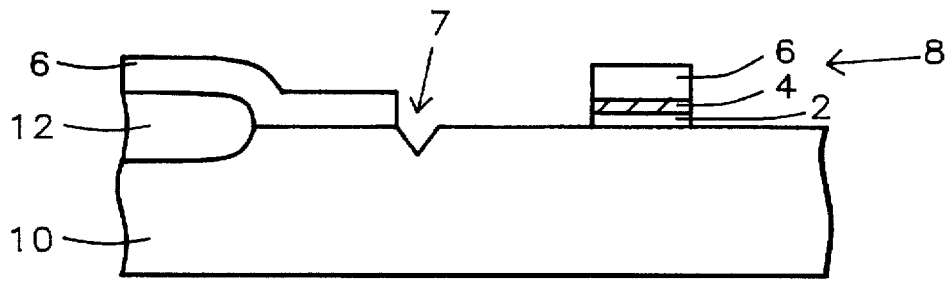
FIG. 4 - Prior Art
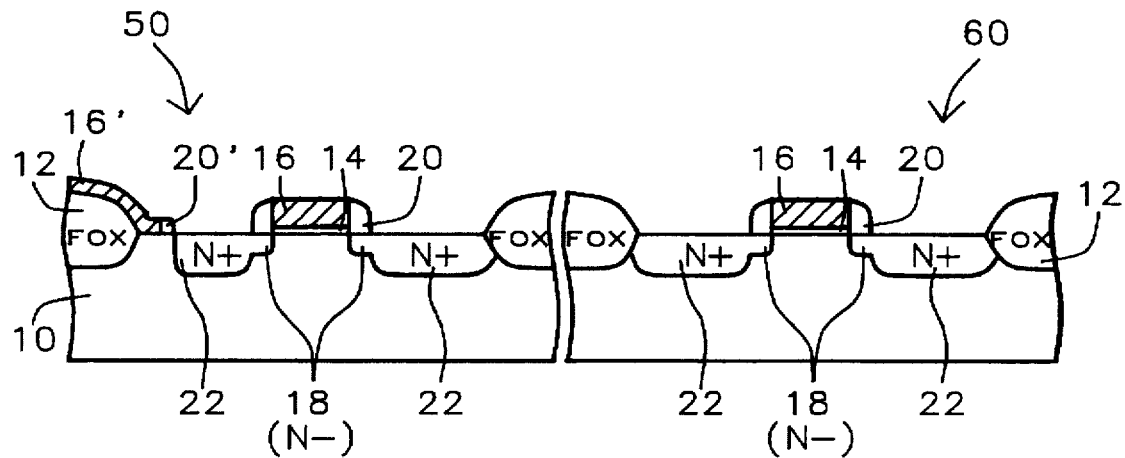
FIG. 5

METHOD OF MAKING A SEMICONDUCTOR DEVICE HAVING HIGH DENSITY 4T SRAM IN LOGIC WITH SALICIDE PROCESS

RELATED PATENT APPLICATIONS

U.S. patent application Ser. No. 08/641,767, U.S. Pat. No. 5,702,988, filed May 2, 1996, "Blending Integrated Circuit Technology", assigned to a common assignee.

U.S. patent application Ser. No. 08/654,131, filed May 28, 1996, "Method of Making a Semiconductor Device having 4T SRAM and Floating Gate Memory", assigned to a common assignee now issued as U.S. Pat. No. 5,605,583.

U.S. patent application Ser. No. 08/654,498, filed May 28, 1996, "Method of Making a Semiconductor Device having 4T SRAM and Mixed Mode in Logics", assigned to a common assignee.

BACKGROUND OF THE INVENTION

(1) Field of the Invention

This invention relates to semiconductor manufacturing, and more particularly to an integrated process for forming a high density SRAM (Static Random Access Memory) and logic using the salicide process, on the same integrated circuit (IC).

(2) Description of the Related Art

Two of the major classifications of devices manufactured by the semiconductor industry are logic and memory. Logic devices are used primarily to process information, while memory devices are used for information storage. Traditionally, while these two device types are found in virtually all electronic systems, such as computers and the like, they have been manufactured on separate integrated circuits and connected only at the card or board level. This has been due to differences in manufacturing processes, cost considerations, economies of scale, and other difficulties in fabricating the different device structures on the same substrate.

However, trends in the semiconductor industry are driving toward making it both desirable and feasible to blend memories and logic on the same integrated circuit (IC). Cost and performance are two of the factors contributing to these trends. While significant economies of scale can be realized by the separate batch processing of large numbers of semiconductor wafers for the two types of device, due to the different process steps needed to produce them, cost savings may also be realized by forming logic and memories on the same integrated circuit. For example, due to the decreased amount of chip area required for a blended logic/memory IC, as compared to the area needed on separate IC's, the product yield can be increased, saving manufacturing cost.

Performance enhancements may also make blending logic and memories on the same IC attractive for particular applications. In electronic systems in which logic and memory are packaged separately, data signals between the two may have to pass through several levels of packaging, i.e., through the originating IC chip to external pins, then through card and/or board wiring, and finally into the receiving IC including its internal wiring, all of which cause undesirable propagation delays. As device densities have increased and device sizes have decreased, transistor switching speeds no longer limit the logic delay or access time of the IC. Rather, the time for the device to charge capacitive loads is the limiting factor for IC performance. The capacitive load is partially dependent on the length of lines interconnecting devices, and so minimizing these connection lengths, as through combining logic and memory on the same IC, will enhance performance.

The applications for blending memory and logic on the same IC are varied, and increasing. See "Silicon Processing for the VLSI Era", Volume 2, Process Integration, S. Wolf, pp. 571–572. Some applications add special logic circuits to memory designs, while others add memory structures to primarily logic IC's.

One example of blending technologies is the formation of both bipolar and CMOS device structures on the same chip, for example as disclosed in U.S. Pat. No. 5,066,602 (Takemoto) and U.S. Pat. No. 5,340,762 (Vora), but the process technology to simultaneously form MOS logic and memories is not discussed.

An example of the addition of memory structures to logic IC's is the Intel 80486 microprocessor, which in addition to the main processor logic has an embedded SRAM (Static Random Access Memory) used as a first-level cache. Such an IC is difficult to fabricate due to differences in the typical processes for forming logic and memory devices.

For example, the salicide (self-aligned silicide) process is used in forming MOS transistors in logic devices, to provide self-aligned, low-resistance source/drain contacts. After the gate oxide and polysilicon gate are formed, and after source/drain ion implantation, a layer of reactive metal such as titanium, cobalt or the like is deposited and annealed. The metal reacts with the silicon to form a silicide, such as $TiSi_2$ (titanium silicide) over the source and drain regions, providing a lower resistance contact than that of the diffused junction alone, and are especially valuable as IC feature sizes have been reduced below 1 micrometer. Salicide is usually used in SRAM for reducing manufacturing cost and increasing product yield, but is necessary for logic products.

An SRAM of the prior art is shown in FIG. 1. Depicted is one memory cell of a poly-load SRAM in which load devices R1 and R2 are high resistance-value resistors. Access transistors N3 and N4 are NMOS devices whose states are controlled by wordline WL, and when conducting connect the bit lines BL1 and BL2 to the main storage element, the flip-flop circuit of NMOS devices N1 and N2.

Buried contacts are used at nodes Q1 and Q2 to connect the doped polysilicon gate electrodes of devices N1 and N2 to the source/drains of access transistors N3 and N4 - this connection is commonly referred to as a local interconnect. In a prior art method of forming a buried contact, as shown in FIGS. 2–4, a buried contact opening 1 is formed by patterning a mask layer comprising a thin gate oxide 2 and thin polysilicon layer 4. The opening is formed adjacent to a field oxide region 12 over a silicon substrate 10. A thick layer of polysilicon 6 is next deposited, and patterning of the thick poly 6, thin poly 4 and gate oxide 2 takes place using conventional lithography and etching. The resultant structure of FIG. 4 has a buried contact 9, and a stacked gate 8 for an FET (Field Effect Transistor) device. During etching of the polysilicon, however, an undesirable substrate trench 7 often results due to misalignment of the etch mask with the edge of thin poly 4.

Returning now to FIG. 1, the SRAM resistive loads R1 and R2 are formed typically of a second polysilicon layer that is connected to nodes Q1/Q2 by forming a butted contact to the underlying first polysilicon. One method of connecting polysilicon lines to diffused regions is a silicide strap, as described in Silicon Processing for the VLSI Era, Vol. II, Wolf, pp. 577–580.

SUMMARY OF THE INVENTION

It is therefore an object of the invention to provide a method for forming logic and memory devices on the same integrated circuit.

It is a further object of the invention to provide an integrated process for forming a high density SRAM (Static Random Access Memory) and logic using the salicide process, on the same integrated circuit (IC).

It is a still further object of the invention to provide a process for forming both an SRAM and logic on the same substrate in which gate-to-source/drain contacts are butted contacts having reduced contact resistance.

It is yet another object of the invention to provide a process for forming both an SRAM and logic on the same substrate in which the SRAM cell size is reduced.

These objects are achieved by a method of forming a local interconnect in an SRAM simultaneously with the formation of a salicide in logic devices on the same semiconductor substrate. A semiconductor substrate on which MOS (Metal Oxide Semiconductor) transistors have been formed is provided. The transistors are separated by field isolation regions, and each transistor has a gate overlying a gate oxide and has source and drain regions in the substrate. Spacers are provided on the sidewalls of the gates, and some of the field oxide regions in the SRAM have polysilicon interconnects, with sidewall spacers. The sidewall spacers are removed from the polysilicon interconnects. A layer of titanium is deposited over the semiconductor substrate. A salicide is formed over the gates, the source and drain regions, and the polysilicon interconnects, so that the local interconnect is formed connecting the polysilicon interconnects to one of the source regions.

BRIEF DESCRIPTION OF THE DRAWINGS

FIG. 1 is a schematic circuit diagram of a poly-load SRAM of the prior art.

FIGS. 2 to 4 are cross-sectional representations of a method of the Prior Art for forming a buried contact.

FIG. 5 to 10 are cross-sectional representations of the method of the invention for forming a high density 4-transistor SRAM with logic using a salicide process.

DESCRIPTION OF THE PREFERRED EMBODIMENTS

Figure 6:
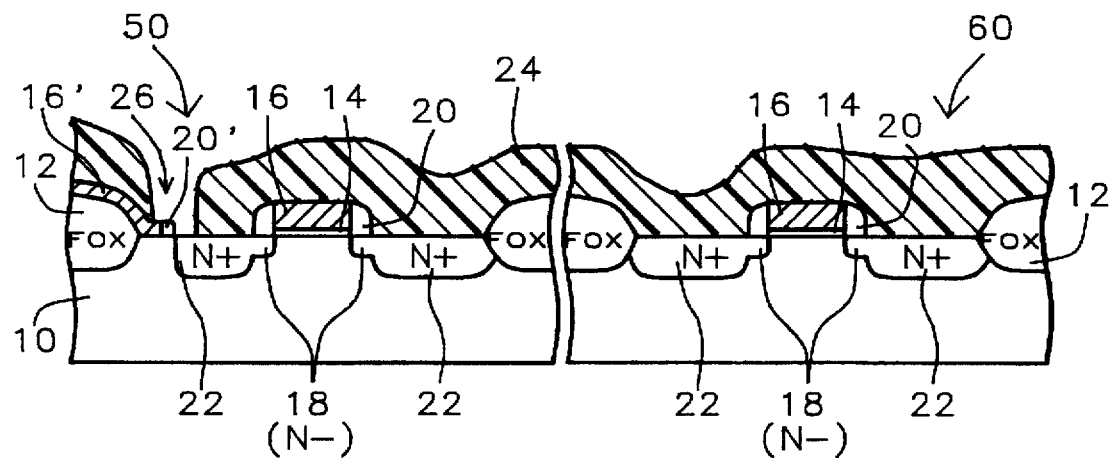

Referring now to FIGS. 5–10, the method of the invention is described. With reference to FIG. 5, a semiconductor substrate 10 is provided on which it is desired to form, simultaneously, both a Static RAM and logic circuits. A portion of the SRAM 50 and a typical logic MOS device 60 are shown. Formation of the structure depicted in FIG. 5 is by processes well known in the art and so will be only briefly described. Field isolation regions 12 are formed, to electrically isolate active device regions on the substrate from one another, by for instance the LOCOS (LOCal Oxidation of Silicon) process to a thickness of between about 3000 and 50000 Angstroms. Gate oxide 14 is grown thermally and has a thickness of between about 60 and 100 Angstroms.

A first layer of polycrystalline silicon (polysilicon) is now deposited to a thickness of between about 1000 and 2500 Angstroms and is doped by $POCl_3$ or in-situ doped polysilicon, as is known in the art. The polysilicon is patterned by conventional lithography and etching to form gate electrodes 16 and polysilicon interconnects 16'.

A first source/drain implant is then performed, which for an NMOS device would be phosphorus P31 at a dosage of between about 1 E 13 and 8 E 13 atoms/$cm^2$ and at an energy of between about 20 and 80 KeV. This implant ultimately results in LDD regions 18 in FIG. 5.

Sidewall spacers 20 and 20' are now formed adjacent to the polysilicon structures, by depositing an insulating material such as $SiO_2$ (silicon oxide) and performing an anisotropic etch to remove the oxide in all but the sidewall regions, as is known in the art. The spacers have a thickness of between about 1000 and 2500 Angstroms.

A heavily doped ion implant is now performed to complete the source/drain regions of both the logic device 60 and SRAM 50, where the existing structures - the sidewall spacers, gate and polysilicon interconnects - are used as an implant mask. To illustrate again with the example of an NMOS device, an N+ implant using arsenic As is performed at a dosage of between about 1 E 15 and 8 E 15 atoms/$cm^2$ and at an energy of between about 20 and 90 KeV. After annealing, this heavy implant results in regions 22 of the memory and logic devices.

Figure 7:
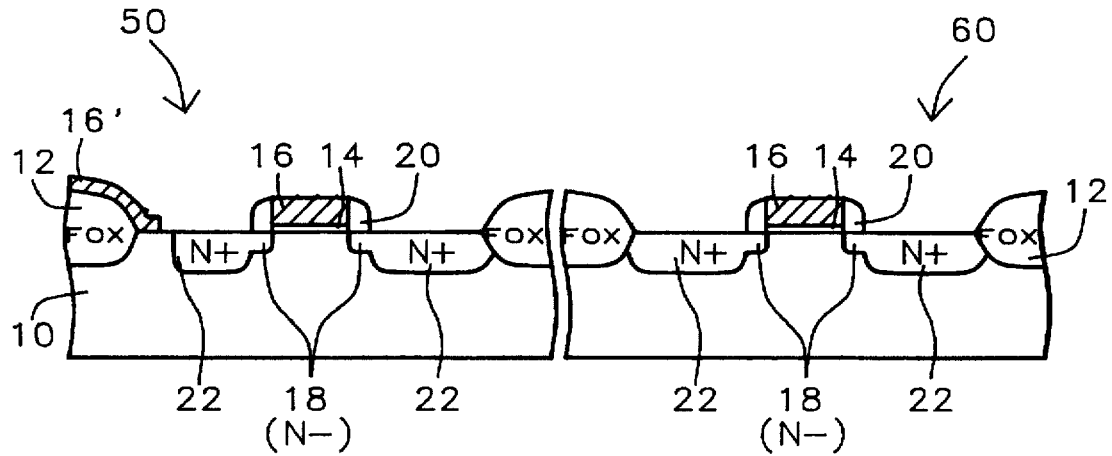

An important step in the inventive process is now described, with reference to FIGS. 6 and 7. In the prior art 4-transistor SRAM cell as shown in FIG. 1, local interconnections between gates and source/drain regions may be made using the gate layer polysilicon and buried contacts, in which the interconnecting polysilicon makes direct contact with the desired source or drain region. In the method of the invention, however, the need for a buried contact is eliminated by the use of a butted contact formed with silicide. A key feature is the removal of sidewall spacer 20'. A photoresist mask 24 is formed by conventional lithography and etching to expose only sidewall spacer 20', through opening 26. The spacer is removed by plasma anisotropic etching with a fluorine-gased chemistry. The photoresist is then removed. Etching of spacer 20' will allow the silicide local interconnect to be formed to connect the poly 16' to source/drain 22, in steps to be described.

Figure 8:
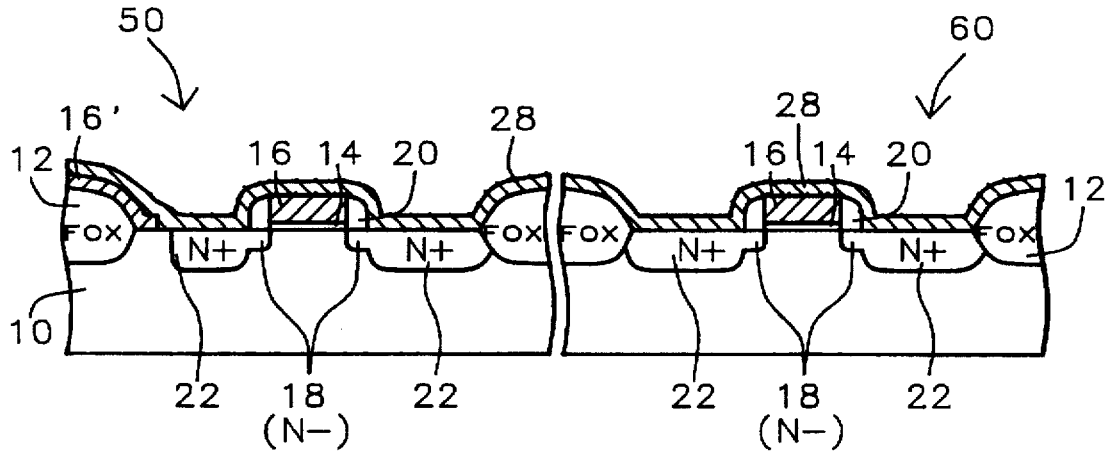
Figure 9:
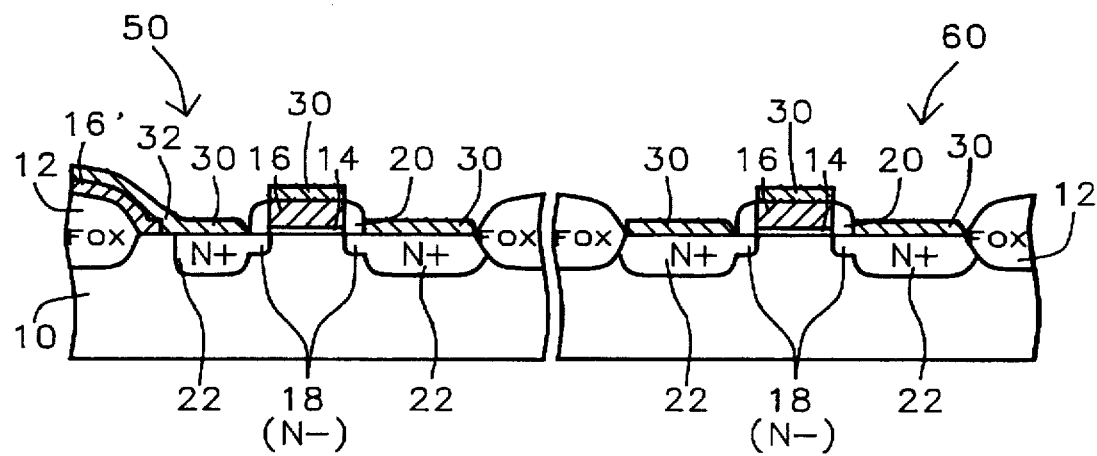
Figure 10:
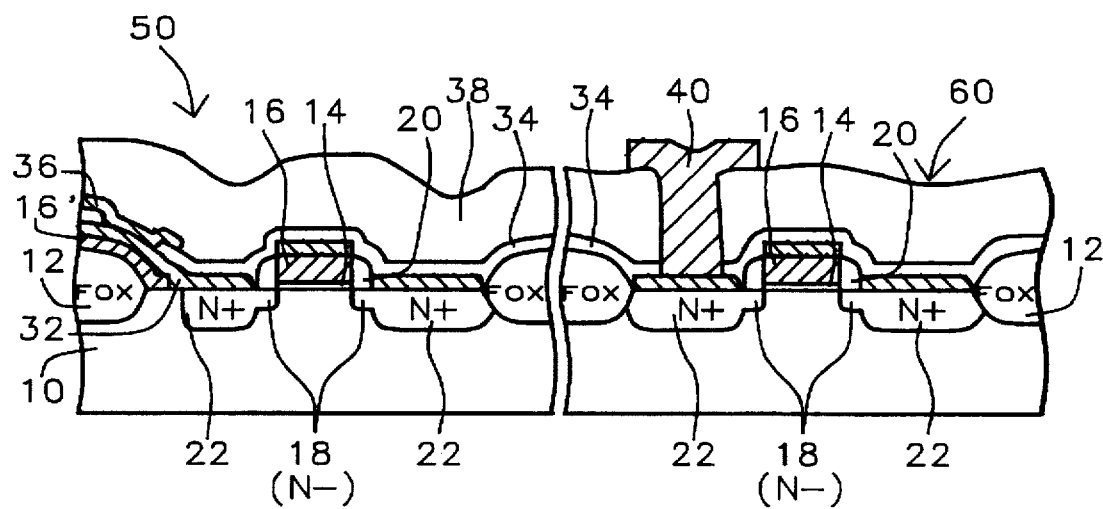

Referring now to FIGS. 8-10, a salicide (self-aligned silicide) process is carried out, in both the logic and memory regions, to form low sheet resistance contacts for the logic and simultaneously to form a silicide local interconnect in the SRAM. In FIG. 8, titanium 28 is deposited over the entire substrate to a thickness of between about 200 and 1000 Angstroms, by sputtering. A first rapid thermal anneal (RTA) is performed, to react the titanium with the polysilicon 16 and 16' and with the single-crystal silicon in the source/drain regions 22, resulting in the creation of a layer of titanium silicide ($TiSi_2$) at these surfaces. The RTA is performed in an ambient of $N_2$ (nitrogen) or $NH_3$ (ammonia) for between about 20 and 60 seconds, at a temperature of between about 600° and 720° C.

After the rapid thermal anneal, a layer of TiN (titanium nitride) covers the $TiSi_2$ over the silicon surfaces, and also directly on the $SiO_2$ surfaces, i.e., the spacers 20 and FOX regions 12. The TiN is stripped from all surfaces using an etch of $NH_3$ (ammonia), $H_2O_2$ (hydrogen peroxide) and $H_2O$ (water). A second RTA is performed in an ambient of $N_2$ or $NH_3$ for between about 25 and 60 seconds, at a temperature of between about 600° and 800° C., for the purpose of transforming the C49 silicide into C54 silicide. The resultant structure of FIG. 9 has the salicided contact structure 30 in logic region 60, as well as at the gate and source of the SRAM FET in memory region 50, and a titanium silicide local interconnect 32 in the memory region 50.

Completion of the logic and SRAM devices may now continue, and will be briefly described. With reference to FIG. 10, an interpoly oxide (IPO) 34 is deposited and etched to provide for a second layer of polysilicon to contact the poly-1/silicide interconnect. A second layer of polysilicon 36 is deposited and patterned, and is used to form the high-resistance-value resistors of the 4-transistor SRAM, and $V_{cc}$ interconnects. A thick oxide 38, such as BPSG (borophosphosilicate glass), PSG or the like is deposited and patterned to allow contacts to the polycide with metal interconnection layer 40.

The advantages of the invention include the fact that trench formation (see FIG. 4 and accompanying discussion) does not occur, since only a single polysilicon is utilized. Furthermore, an additional degree of freedom is gained for the first polysilicon of the invention over a buried contact process. That is, since the polysilicon is not required for making contact to the active region 22, it may be used for other purposes or design rules may be tightened. In addition, contact resistance is lowered through the use of a silicide at the poly-2 to poly-1 interface. And finally, a smaller cell size may be accomplished using the butted contact of the invention, as opposed to a buried contact that requires additional substrate area.

While the invention has been particularly shown and described with reference to the preferred embodiments thereof, it will be understood by those skilled in the art that various changes in form and details may be made without departing from the spirit and scope of the invention.

What is claimed is:

1. A method of forming a local interconnect in an SRAM simultaneously with the formation of a salicide in logic devices on the same semiconductor substrate, comprising the steps of:

providing a semiconductor substrate having MOS (Metal Oxide Semiconductor) transistors formed therein, separated by field isolation regions, each said transistor comprising a gate overlying a gate oxide and having source and drain regions in said substrate, with spacers on the sidewalls of said gates, and wherein some of said field oxide regions in said SRAM have polysilicon interconnects, with sidewall spacers, thereover; ion implanting a heavily doped implant into said source/drain regions, while said sidewall spacers are in place;

removing said sidewall spacers from said polysilicon interconnects;

depositing a layer of titanium over said semiconductor substrate; and forming said salicide over said gates, said source and drain regions, and said polysilicon interconnects, and whereby said local interconnect is formed connecting said polysilicon interconnects to one of said source regions.

2. The method of claim 1 wherein said removing said insulating spacers from sidewalls of said polysilicon interconnects comprises the steps of:

forming a layer of photoresist material over said semiconductor substrate;

forming openings in said photoresist material to expose said insulating spacers;

etching said insulating spacers by plasma etching using a fluorine-based chemistry; and removing said photoresist material.

3. The method of claim 1 wherein said forming said salicide comprises the steps of:

performing a first rapid thermal anneal whereby a layer of titanium silicide/titanium nitride is formed over said polysilicon interconnects, gate electrodes and active regions, and a layer of titanium nitride is formed over said insullating spacers;

removing all of said titanium nitride; and performing a second rapid thermal anneal.

4. The method of claim 1 wherein said titanium is deposited to a thickness of between about 200 and 1000 Angstroms.

5. The method of claim 3 wherein said first rapid thermal anneal is performed at a temperature of between about 600° and 720° C., in an ambient gas selected from the group consisting of $N_2$ (nitrogen) and $NH_3$ (ammonia) for between about 20 and 60 seconds.

6. The method of claim 3 wherein said second rapid thermal anneal is performed at a temperature of between about 600° and 800° C., in an ambient gas selected from the group consisting of $N_2$ (nitrogen) and $NH_3$ (ammonia) for between about 20 and 60 seconds.

7. A method of forming an SRAM (Static Random Access Memory) and logic on a single semiconductor substrate, in a logic region and memory region, respectively, comprising the steps of:

providing a semiconductor substrate;

forming field isolation regions in said semiconductor substrate, in both said logic and memory regions;

forming a gate oxide over said substrate between said field isolation regions;

depositing a first polysilicon layer over said gate oxide;

patterning said first polysilicon layer to form gate electrodes over a portion of said gate oxide, in both memory and logic regions, and to form polysilicon interconnects over said field isolation regions only in said memory region;

forming lightly doped drain (LDD) active regions in said substrate, adjacent to each said gate;

forming insulating spacers on sidewalls of said gate electrodes and said polysilicon interconnects;

completing formation of said active regions by a heavy ion implant;

removing said insulating spacers, after said formation of said active regions by a heavy ion implant, from sidewalls of said polysilicon interconnects; and forming a layer of titanium silicide over said gate electrodes, polysilicon interconnects and active regions, whereby said titanium silicide electrically connects said polysilicon interconnects and said active regions in said memory region.

8. The method of claim 7 wherein said removing said insulating spacers from sidewalls of said polysilicon interconnects comprises the steps of:

forming a layer of photoresist material over said semiconductor substrate;

forming openings in said photoresist material to expose said insulating spacers;

etching said insulating spacers by plasma etching with fluorine-based chemistry; and removing said photoresist material.

9. The method of claim 7 wherein said forming a layer of titanium silicide comprises the steps of:

depositing a layer of titanium over said semiconductor substrate;

performing a first rapid thermal anneal whereby a layer of titanium silicide/titanium nitride is formed over said polysilicon interconnects, gate electrodes and active regions, and a layer of titanium nitride is formed over said insulating spacers;

removing all of said titanium nitride; and performing a second rapid thermal anneal.

10. The method of claim 9 wherein said titanium is deposited to a thickness of between about 200 and 1000 Angstroms.

11. The method of claim 9 wherein said first rapid thermal anneal is performed at a temperature of between about 600° and 720° C., in an ambient gas selected from the group consisting of $N_2$ (nitrogen) and $NH_3$ (ammonia) for between about 20 and 60 seconds.

12. The method of claim 9 wherein said second rapid thermal anneal is performed at a temperature of between about 600° and 800° C., in an ambient gas selected from the group consisting of $N_2$ (nitrogen) and $NH_3$ (ammonia) for between about 20 and 60 seconds.

13. The method of claim 7 wherein said polysilicon interconnects are connected to gate electrodes of other transistors in said SRAM.

* * * * *